(12) United States Patent
Egawa et al.

(10) Patent No.: US 8,018,128 B2
(45) Date of Patent: Sep. 13, 2011

(54) MICROCHANNEL STRUCTURE AND ITS MANUFACTURING METHOD, LIGHT SOURCE DEVICE, AND PROJECTOR

(75) Inventors: Akira Egawa, Shiojiri (JP); Satoshi Kinoshita, Matsumoto (JP); Kunihiko Takagi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 1352 days.

(21) Appl. No.: 11/332,144

(22) Filed: Jan. 17, 2006

(65) Prior Publication Data

US 2006/0180298 A1  Aug. 17, 2006

(30) Foreign Application Priority Data

Feb. 14, 2005  (JP) ................................ 2005-035868
Oct. 28, 2005  (JP) ................................ 2005-314061

(51) Int. Cl.
  *H01J 1/58* (2006.01)
  *H01J 7/26* (2006.01)
  *H01J 61/52* (2006.01)
(52) U.S. Cl. ............................ 313/35; 313/44; 165/80.4
(58) Field of Classification Search ............ 29/890.035; 165/80.4; 361/699, 700; 313/22, 35, 44
See application file for complete search history.

(56) References Cited

U.S. PATENT DOCUMENTS

| | | | |
|---|---|---|---|
| 3,829,945 A * | 8/1974 | Kanzler et al. ............. | 29/890.03 |
| 4,667,768 A * | 5/1987 | Wirt ............................. | 181/286 |
| 4,723,597 A * | 2/1988 | Sonoda ........................ | 165/133 |
| 5,011,810 A | 4/1991 | Michimoto et al. | |
| 5,099,576 A * | 3/1992 | Shinmura ................ | 29/890.049 |
| 5,157,893 A * | 10/1992 | Benson et al. ............... | 52/789.1 |
| 5,538,079 A * | 7/1996 | Pawlick ........................ | 165/153 |
| 5,673,177 A * | 9/1997 | Brodsky et al. .............. | 361/704 |
| 6,230,789 B1 * | 5/2001 | Pei et al. ..................... | 165/80.3 |
| 6,260,610 B1 * | 7/2001 | Biber et al. .................. | 165/80.3 |
| 6,287,524 B1 | 9/2001 | Hums et al. | |
| 6,710,013 B1 | 3/2004 | Kato et al. | |
| 6,833,117 B1 | 12/2004 | Kato et al. | |
| 2001/0013224 A1 * | 8/2001 | Ohkubo et al. .................. | 62/3.7 |
| 2002/0029876 A1 * | 3/2002 | Fast ............................. | 165/185 |
| 2002/0079095 A1 * | 6/2002 | Davies et al. ................ | 165/170 |
| 2003/0174517 A1 * | 9/2003 | Kiraly et al. ................. | 362/555 |
| 2007/0062673 A1 * | 3/2007 | Olesen ........................ | 165/80.4 |

FOREIGN PATENT DOCUMENTS

| | | |
|---|---|---|
| JP | 48-091111 A | 7/1973 |
| JP | 48-056208 A | 11/1973 |
| JP | 61-84389 | 6/1986 |
| JP | A-63 319003 | 12/1988 |
| JP | 01-310753 A | 12/1989 |
| JP | 02-099144 A | 4/1990 |
| JP | 10-028871 A | 2/1998 |
| JP | 11-319582 A | 11/1999 |
| JP | A-2001-062537 | 3/2001 |
| JP | A-2002-532914 | 10/2002 |

(Continued)

*Primary Examiner* — Nimeshkumar Patel
*Assistant Examiner* — Glenn Zimmerman
(74) *Attorney, Agent, or Firm* — Oliff & Berridge, PLC

(57) ABSTRACT

A microchannel structure with a fine flow path through which a fluid flows, includes: a wavy plate member fabricated into a wavy form; an external peripheral wall member that surrounds the wavy plate member; and a spacer that ensures a spacing between opposed portions of the wavy plate member, wherein the fine flow path is defined by the wavy plate member and the external peripheral wall member.

9 Claims, 14 Drawing Sheets

FOREIGN PATENT DOCUMENTS

| | | |
|---|---|---|
| JP | A-2005-024964 | 1/2005 |
| JP | A-2005-027485 | 1/2005 |
| WO | WO99-24165 A | 5/1999 |
| WO | WO 00/36893 | 6/2000 |
| WO | WO 03/024590 A1 | 3/2003 |
| WO | WO 2005040709 A1 * | 5/2005 |

* cited by examiner

F I G. 4A
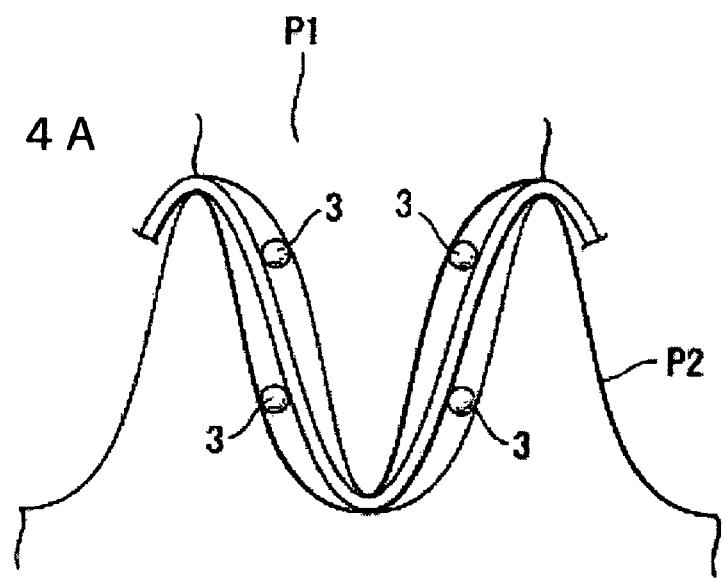
F I G. 4B
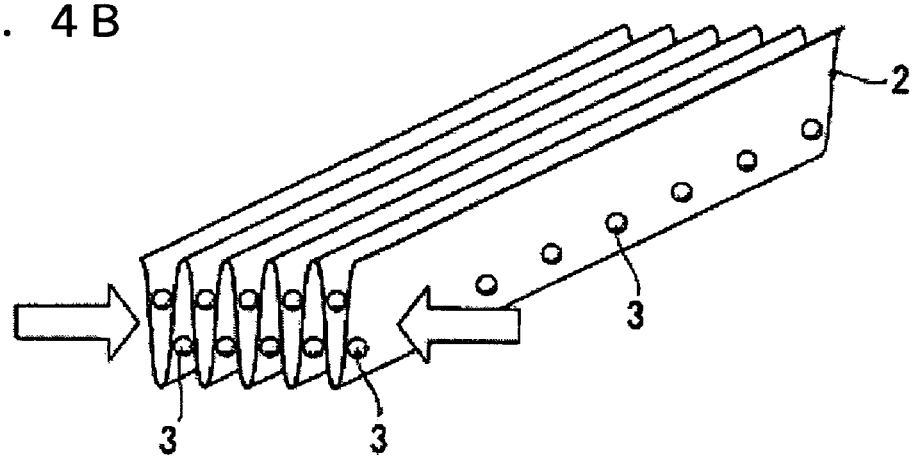
F I G. 4C
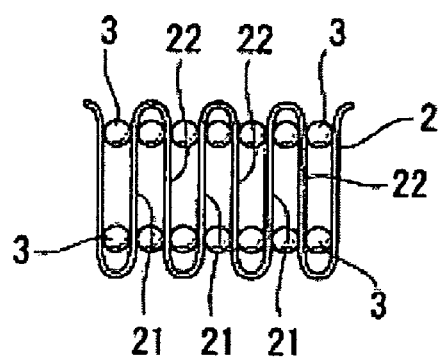

MICROCHANNEL STRUCTURE AND ITS MANUFACTURING METHOD, LIGHT SOURCE DEVICE, AND PROJECTOR

BACKGROUND

1. Technical Field

The present invention relates to a microchannel structure and its manufacturing method, a light source device and a projector.

2. Related Art

The microchannel structure is a structure including at least two fine flow paths having a width of a few micrometers to some hundreds of micrometers, and is used in various applications. For example, microchannel structure is used as a heat exchanging component having a high cooling performance when a cooling medium (fluid) is flowed through the fine flow paths, and is used as a transporting path for a small flow amount of fluid.

For example, in the case of a heat exchanger that is a structure including at least two flow paths having a width of a few millimeters to a few centimeters, such heat exchanger can be mass-produced at a low cost when the wavy plate member formed by press working is accommodated and disposed in an accommodation portion of the external peripheral wall member as shown in JP-UM-A-61-84389.

However, it is difficult to perform microfabrication by press working. Therefore, in the case of forming at least two flow paths having a width of a few micrometers to some hundreds of micrometers as described above, the flow paths are formed by silicon etching in general.

However, use of silicon to form flow paths is more unfavorable in comparison to the case where a metal such as copper is used to form flow paths from the standpoint of a heat conductive property. Therefore, it becomes difficult to use a microchannel structure as a heat exchanging component having a high cooling performance.

In contrast, in the case where a metal such as copper is used to form flow paths having a width of a few micrometers to some hundreds of micrometers, they can formed by a fabrication method such as a wire-electrical discharge-processing. However, it takes much time to form flow paths by the wire-electrical discharge-processing and as such, the wire-electrical discharge-processing is not suitable as a fabrication method for low-cost mass production of microchannel structures.

SUMMARY

An advantage of some aspects of the invention is to enable short-time and low-cost manufacture of a microchannel structure.

For the purpose of achieving the advantage, a microchannel structure according to an aspect of the invention has a fine flow path through which a fluid flows and includes: a wavy plate member fabricated into a wavy form; an external peripheral wall member that surrounds the wavy plate member; and a spacer that ensures a spacing between opposed portions of the wavy plate member, wherein the flow path is defined by the wavy plate member and external peripheral wall member.

With a microchannel structure having such features, the spacer ensures the spacing between the opposed portions of the wavy plate member. Therefore, when the wavy plate member is surrounded by the external peripheral wall member, the clogging of the flow path owing to contact of the opposed portions of the wavy plate member can be restrained from taking place.

The wavy plate member can be formed readily by performing press working on the plate-like member, and then pressuring the resultant member from the direction of arrangement of the crests and troughs. Therefore, it becomes possible to manufacture a microchannel structure according to the aspect of the invention at a low cost for a short time.

In regard to the microchannel structure, the following arrangements may be adopted specifically. The first is the spacer is a spherical member disposed between the opposed portions. The second is the spacer is a protruding portion constituted by a part of the opposed portion.

Also, as for the microchannel structure, it is preferable to adopt the following arrangement: the top and bottom portions of the wavy plate member are in contact with the external peripheral wall member.

By adoption of such arrangement, the top and bottom portions of the wavy plate member are brought into contact with the external peripheral wall member, and thus the efficiency of heat conduction between the wavy plate member and the external peripheral wall member is enhanced. Therefore, the microchannel structure is made superior in cooling performance.

Further, as for the microchannel structure, it is preferable to adopt the following arrangement: the wavy plate member and the external peripheral wall member are formed out of copper.

By adoption of such arrangement, the efficiency of heat conduction is further enhanced and therefore the cooling performance is improved further.

In regard to the microchannel structure, the following arrangement may be adopted: positioning grooves are formed in the external peripheral wall member, in which the top and bottom portions of the wavy plate member are fit individually.

By adoption of such arrangement, fitting the top and bottom portions of the wavy plate member in the grooves can facilitate positioning of the wavy plate member. Further, when the form of the notch is made a semicircle or triangle in sectional view, the contact area of the wavy plate member and the upper or lower portions of the external peripheral wall member is increased, and thus the efficiency of heat conduction between the wavy plate member and the external peripheral wall member is enhanced. Therefore, the microchannel structure is made superior in cooling performance.

Also, in regard to the microchannel structure, the following arrangement may be adopted: a paste material having a heat conductive property is interposed between the wavy plate member and the external peripheral wall member.

By adoption of such arrangement, the wavy plate member and the external peripheral wall member can be connected thermally with reliability, and the efficiency of heat conduction can be increased. Thus, the microchannel structure is made superior in cooling performance.

Further, in regard to the microchannel structure, the following arrangement may be adopted: the microchannel structure includes a notch structure that prevents the wavy plate member from being out of position in a direction of flow of the fluid, in the external peripheral wall member.

By adoption of such arrangement, it becomes possible to prevent the fluid flow from bringing the wavy plate member out of position in the direction of the fluid flow.

Now, a light source device according to an aspect of the invention includes: a solid light-emitting source that emits light and generates heat when the solid light-emitting source is supplied with a current; and a base on which the solid light-emitting source is put, wherein the microchannel structure is used as the base.

With the microchannel structure, the clogging of the flow path owing to contact of the opposed portions of the wavy plate member can be restrained from taking place. Therefore, the light source device is made more superior in reliability.

A projector according to an aspect of the invention includes the light source device.

Therefore, the projector is made more superior in reliability.

A method of manufacturing a microchannel structure according to an aspect of the invention is a method of manufacturing a microchannel structure having a fine flow path through which a fluid flows, including the steps of: shaping a plate-like member into a wavy plate member of a wavy form by press working; pressuring the wavy plate member from its opposite sides in a direction of arrangement of the crests and troughs; and disposing the wavy plate member in an accommodation portion formed in an external peripheral wall member, whereby the fine flow path is formed.

According to the method of manufacturing a microchannel structure having such features, a plate-like member is shaped into a wavy plate member of a wavy form by press working at the press working step. Then, the wavy plate member is pressured from its opposite sides in the direction of arrangement of the crests and troughs at the pressuring step. Thereafter, the pressured wavy plate member is accommodated and disposed in an accommodation portion formed in the external peripheral wall member at the wavy plate member-disposing step. Thus, the fine flow path is formed.

In other words, according to the method of manufacturing a microchannel structure, the spacing between the opposed portions of the wavy plate member can be made smaller readily by pressuring the wavy plate member from its opposite sides in the direction of arrangement of the crests and troughs. Therefore, it is possible to form fine flow paths for a much shorter time in comparison with the case where they are formed by e.g. wire-electrical discharge-processing. Further, the press working step, pressuring step, and wavy plate member-disposing step are a processing step that can be carried out at a much lower cost in comparison with the wire-electrical discharge-processing and the like, and the etching. Hence, the method of manufacturing a microchannel structure enables the manufacture of a microchannel structure at an extremely low cost.

Therefore, with the method of manufacturing a microchannel structure M1, it becomes possible to manufacture a microchannel structure for a short time at a low cost.

Also, according to the method of manufacturing a microchannel structure, the precision of pitch of the wavy plate member can be ensured by the press working step. Therefore, the designed cooling performance desired in designing can be realized with high precision.

Still further, as for the method of manufacturing a microchannel structure, the following arrangement may be adopted: the method further includes the step of forming a spacer to ensure a spacing between opposed portions of the wavy plate member.

By adoption of such arrangement, even when the wavy plate member is pressured from its opposite sides in the direction of arrangement of the crests and troughs at the pressuring step, the contact between the opposed portions of the wavy plate member is prevented. Therefore, the clogging of the flow path can be prevented.

Incidentally, it is preferable that the spacer-forming step is performed prior to the press working step. By carrying out the spacer-forming step before the press working step, a spacer can be formed on the plate-like member. Therefore, it becomes possible to form a spacer readily.

Specifically, as for the method of manufacturing a microchannel structure, the following arrangement may be adopted: the spacer-forming step is a step to dispose a spherical member on a surface of the plate-like member. In addition, it is possible to adopt the following arrangement: the spacer-forming step is a step to form a protruding portion in a part of the plate-like member.

Also, in the method of manufacturing a microchannel structure, the plate-like member has a resin layer formed on a surface thereof, and the method further includes the step of removing the resin layer after the pressuring step.

By adoption of such arrangement, it is becomes possible to prevent the contact between the opposed portions of the wavy plate member when the wavy plate member is pressured from its opposite sides in the direction of arrangement of the crests and troughs at the pressuring step. Hence, the clogging of the flow path can be prevented.

The resin layer may be formed on only one face of the plate-like member.

Further, as for the method of manufacturing a microchannel structure, it is preferable to adopt the following arrangement: when the wavy plate member-disposing step includes: disposing the wavy plate member in a groove formed in one of lower and upper portions of the external peripheral wall member; and bonding the other of the lower and upper portions of the external peripheral wall member to the one of the lower and upper portions with the wavy plate member disposed in its groove, the height of the wavy plate member from its top portion to its bottom portion is set so as to be higher than that of the groove.

By adoption of such arrangement, when one of the upper and lower portions of the external peripheral wall member is bonded to the other of the upper and lower portions, the top and bottom portions of the wavy plate member are brought into contact with the external peripheral wall member with reliability. Making the top and bottom portions of the wavy plate member contact with the external peripheral wall member in this way can increase the efficiency of heat conduction between the wavy plate member and the external peripheral wall member. Therefore, it becomes possible to manufacture a microchannel structure superior in cooling performance.

Also, by bringing the top and bottom portions of the wavy plate member in contact with the external peripheral wall member, it becomes possible to keep the precision of pitch of the wavy plate member. Therefore, the designed cooling performance desired in designing can be realized with high precision.

Further, the following arrangement may be adopted: the method of manufacturing a microchannel structure further includes the step of planarizing the top portion and/or the bottom portion of the wavy plate member. In this case, the contact area of the wavy plate member and the external peripheral wall member is increased, which increases the efficiency of heat conduction between the wavy plate member and the external peripheral wall member. Therefore, it becomes possible to manufacture a microchannel structure more superior in cooling performance.

In regard to the method of manufacturing a microchannel structure, it is preferable to adopt the following arrangement: the plate-like member and the external peripheral wall member are formed out of copper.

By adoption of such arrangement, it becomes possible to manufacture a microchannel structure superior in efficiency of heat conduction at a low cost. In addition, it becomes possible to manufacture a microchannel structure more readily because copper has an excellent property in ease of fabrication.

BRIEF DESCRIPTION OF THE DRAWINGS

The invention will be described with reference to the accompanying drawings, wherein like numbers reference like elements.

FIGS. 4A-4C are views of assistance in explaining the method of manufacturing the microchannel structure according to the first embodiment of the invention.

DESCRIPTION OF EXEMPLARY EMBODIMENTS

Figure 1:
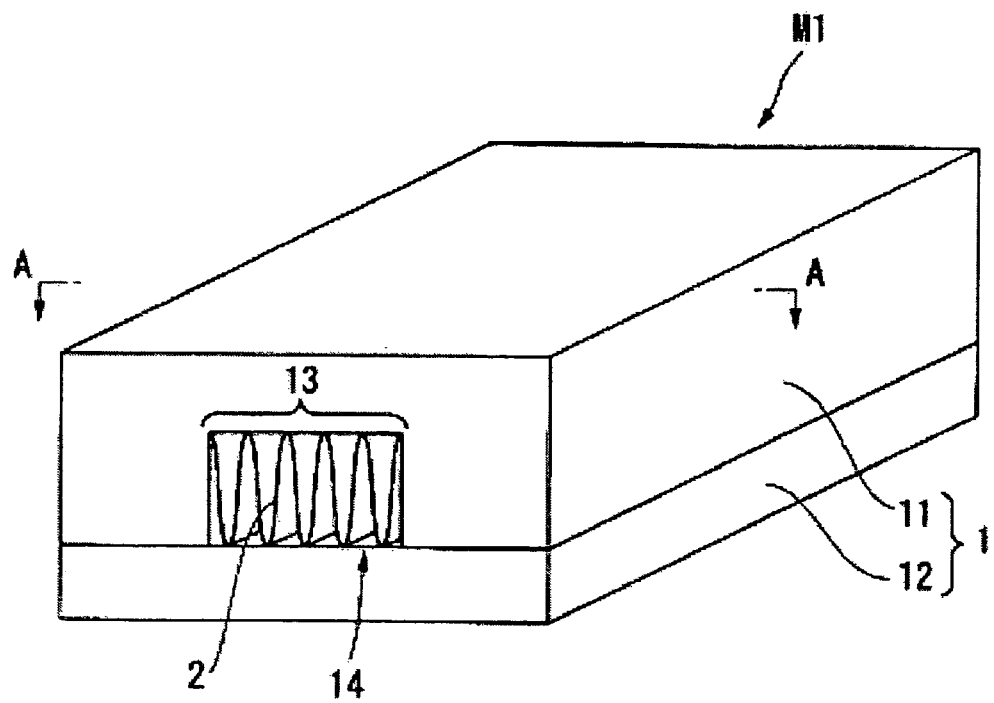
FIG. 1 is a perspective view of a microchannel structure according to a first embodiment of the invention.

Embodiments of a microchannel structure and its manufacturing method, a light source device, and a projector in association with the invention will be described below with reference to the drawings.

In the drawings, the scales of members are appropriately changed to illustrate the members with recognizable dimensions.

First Embodiment

FIG. 1 is a perspective view of a microchannel structure M1 of the embodiment.

As illustrated in the drawing, the microchannel structure M1 of the first embodiment includes: an external peripheral wall member 1; and a wavy plate member 2.

The external peripheral wall member 1 is composed of an external peripheral wall member upper portion 11 and an external peripheral wall member lower portion 12. The external peripheral wall member upper portion 11 has a groove 13 on the side of its lower face. The external peripheral wall member lower portion 12 is bonded to the lower face of the external peripheral wall member upper portion 11, whereby an accommodation portion 14 is formed to accommodate and dispose the wavy plate member 2. In other words, the wavy plate member 2 is surrounded by wall faces of the groove 13 and the upper face of the external peripheral wall member lower portion 12 of the external peripheral wall member 1.

The wavy plate member 2 is a plate-like member that is shaped into a wavy form, and its ends in the direction of the ridge of the wavy form are open. The wavy plate member 2 is accommodated and disposed in the accommodation portion 14 of the external peripheral wall member 1. When such wavy plate member 2 is accommodated and disposed in the accommodation portion 14, at least two fine flow paths extending in the direction of the ridge of the wavy plate member 2 are formed.

Figure 2:
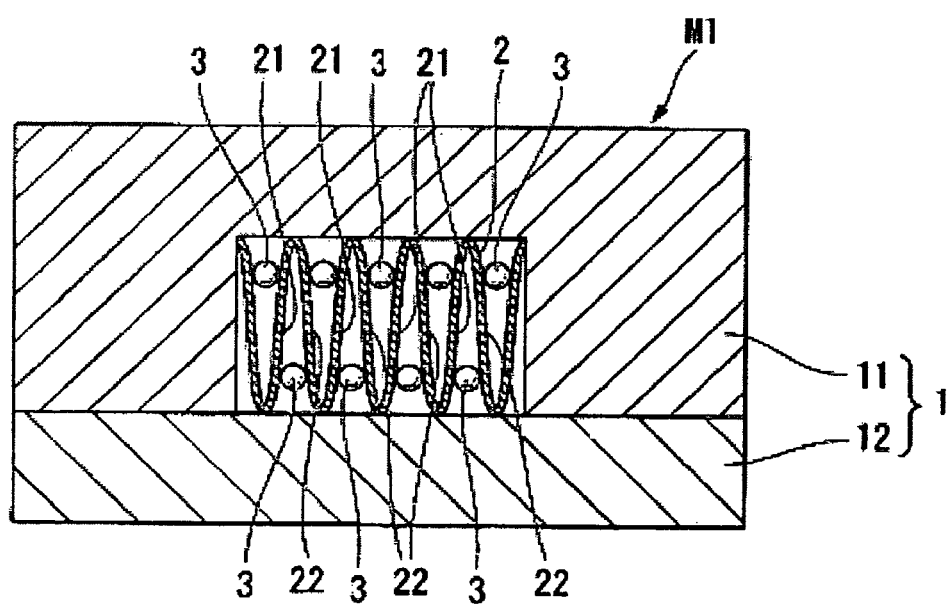
FIG. 2 is a sectional view of the microchannel structure taken along the line A-A in FIG. 1.

FIG. 2 is a sectional view of the microchannel structure taken along the line A-A in FIG. 1. As shown in the drawing, the microchannel structure M1 of the embodiment includes at least two spherical members (spacers) 3 each serving as a spacer to ensure the spacing between opposed portions 21, 22 of the wavy plate member 2. The spherical members 3 prevent the opposed portions 21, 22 of the wavy plate member 2 from coming close to each other within a distance equal to or less than the diameter of the spherical members 3. In other words, the spherical members 3 prevent the clogging of the fine flow paths caused by the mutual contact of the opposed portions 21, 22 of the wavy plate member 2.

As shown in FIG. 2, in the microchannel structure M1 of this embodiment, the top and bottom portions of the wavy plate member 2 are in contact with the external peripheral wall member 1. On this account, the efficiency of heat conduction between the wavy plate member 2 and the external peripheral wall member 1 are enhanced.

Also, with the microchannel structure M1 of this embodiment, the wavy plate member 2 and external peripheral wall member 1 are formed out of copper. Therefore, the efficiency of heat conduction of the microchannel structure M1 is further increased.

With the microchannel structure M1 of this embodiment having a configuration like this, the spherical members 3 prevent the opposed portions 21, 22 of the wavy plate member 2 from approaching each other within a distance equal to or less than the diameter of the spherical members 3. Hence, it becomes possible to prevent the clogging of the fine flow paths caused by the mutual contact of the opposed portions 21, 22 of the wavy plate member 2.

In the case where the microchannel structure M1 is used as a heat exchanging component, placement of the spherical members 3 causes a fluid flowing along the direction of the ridge of the wavy plate member 2 to impinge on the spherical members 3, whereby a turbulent flow is formed. Therefore, it becomes possible to transfer heat from the wavy plate member 2 to the fluid efficiently.

Next, a method of manufacturing a microchannel structure M1 according to the first embodiment will be described.

Figure 3A:
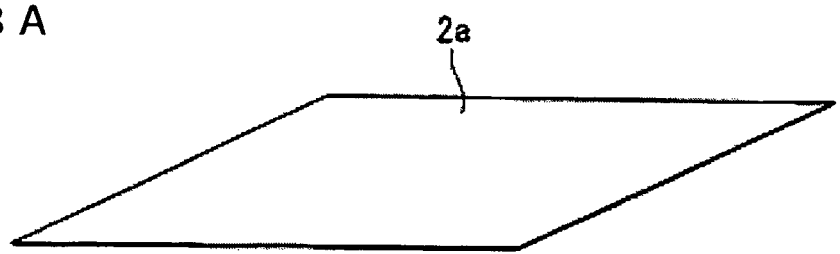
FIGS. 3A-3B are views of assistance in explaining a method of manufacturing the microchannel structure according to the first embodiment of the invention.

As shown in FIG. 3A, a plate-like member 2a, which is formed out of copper, is prepared fist. Incidentally, the thickness of the plate-like member 2a represents the thickness of the flow-path walls of the fine flow paths, and concretely it is 50 to 100 µm approximately.

Figure 3B:
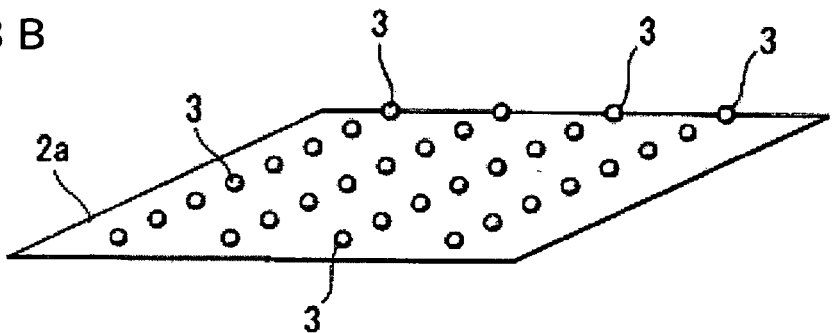

Second, as shown in FIG. 3B, spherical members 3 used as spacers are disposed in position on a surface of the plate-like member 2a (spacer-forming step). The spherical members 3 may be disposed on a surface of the plate-like member 2a randomly. However, when the spherical members are disposed randomly, there is apprehension that they are disposed in locations where the spherical members interfere with press working during a later press working step. Therefore, it is preferable to perform the positioning of the spherical members to a certain degree and then dispose the members. Specifically, as the method to perform positioning of the spherical members 3 may be adopted e.g. a method such that the positioning of the spherical members 3 is performed by: sticking solder to a region on a surface of the plate-like member 2a where spherical members are to be disposed; scattering the spherical members 3 all over the surface of the plate-like member 2a, to which the solder has been stuck; and then removing the spherical members 3 that do not adhere to the solder.

Figure 3C:
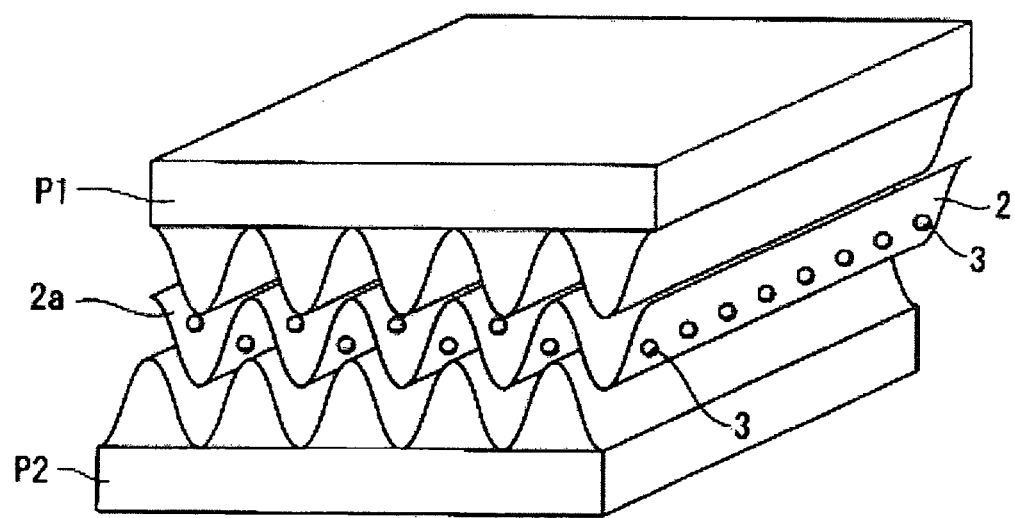

Subsequently, as shown in FIG. 3C, the plate-like member 2a with the spherical members 3 disposed thereon is pinched between and by an upper press portion P1 and a lower press portion P2 of a press machine, thereby performing press working (press working step). Incidentally, the upper press portion P1 and the lower press portion P2 have a form having crests and troughs so that the plate-like member 2a is shaped into a wavy plate member 2 when it pressed. Further, as shown in FIG. 4A, the geometry of the upper press portion P1 and lower press portion P2 is designed so that when they are meshed with each other, spaces for the spherical members 3 are formed in a lateral direction perpendicular to the direction of the ridge and the direction of the meshing.

Accordingly, the wavy plate member 2 is formed by using such press machine to press the plate-like member 2a.

After that, as shown in FIG. 4B, the wavy plate member 2 is pressured from the opposite sides along the direction of arrangement of the crests and troughs (pressuring step). By pressuring the wavy plate member 2, which has been shaped at the press working step, from the opposite sides in the direction of arrangement of the crests and troughs in this way, the opposed portions 21, 22 of the wavy plate member 2 can be made to come close to each other easily.

Also, with the method of manufacturing a microchannel structure, the spherical members 3 are disposed in position on a surface of the plate-like member 2a and as such, it is possible to prevent the opposed portions 21, 22 of the wavy plate member 2 from approaching each other within a distance smaller than the diameter of the spherical members 3 as shown in FIG. 4C.

Figure 5A:
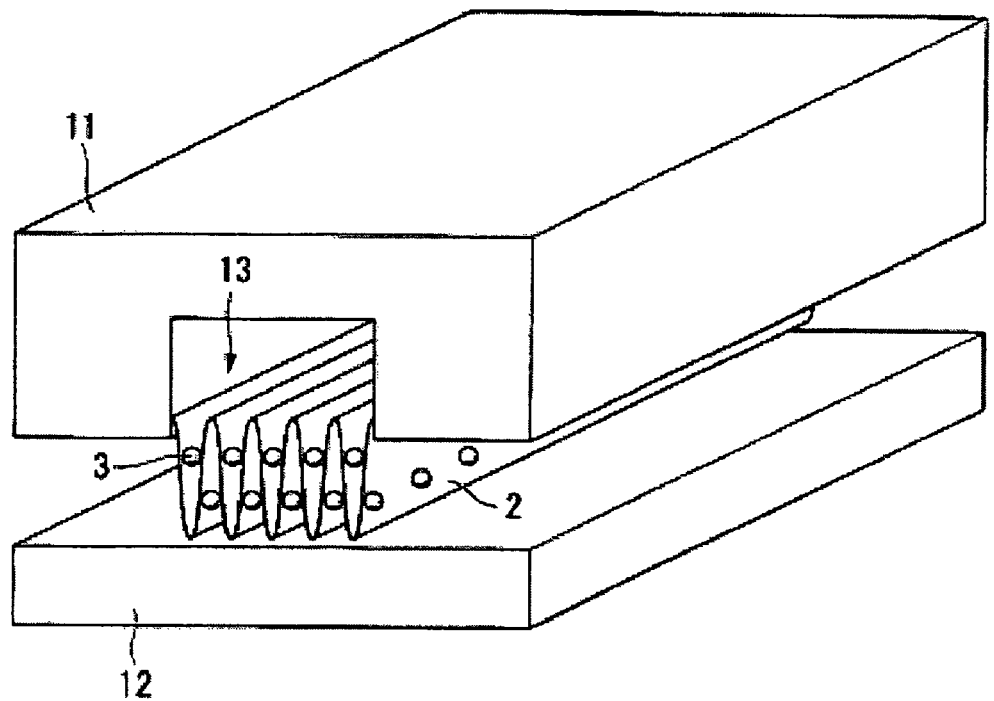
FIGS. 5A and 5B are views of assistance in explaining the method of manufacturing the microchannel structure according to the first embodiment of the invention.

Then, as shown in FIG. 5A, the wavy plate member 2, which has been pressured at the pressuring step, is accommodated inside the groove 13 formed in the external peripheral wall member upper portion 11, followed by bonding the external peripheral wall member lower portion 12 to the upper portion 11. Thus, the wavy plate member 2 is accommodated and disposed in the accommodation portion 14 of the external peripheral wall member 1 (wavy plate member-disposing step). With the steps that have been described, the microchannel structure M1 of the first embodiment having fine flow paths is manufactured.

Figure 5B:
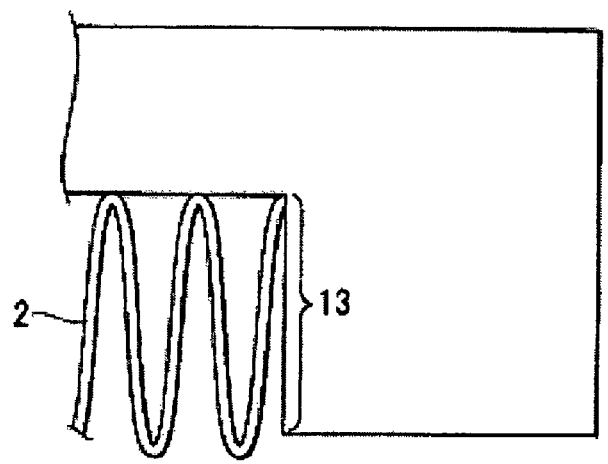

As for the method of manufacturing a microchannel structure, because the wavy plate member 2 is accommodated in the groove 13 formed in the external peripheral wall member upper portion 11 and then the external peripheral wall member lower portion 12 is bonded to the upper portion 11, it is preferable to set the height of the wavy plate member 2 from its top portion to the bottom portion higher than that of the groove 13 as shown in FIG. 5B. In the case where the height of the wavy plate member 2 from its top portion to the bottom portion is set higher than that of the groove 13 like this, the wavy plate member 2 is pressured by the external peripheral wall member upper portion 11 and the external peripheral wall member lower portion 12 in the up and down directions of the groove 13 when the external peripheral wall member lower portion 12 is bonded to the upper portion 11. This makes it possible to widen the contact area of the wavy plate member 2 and the external peripheral wall member 1, and therefore the efficiency of heat conduction can be increased. Incidentally, the illustration of the spherical members 3 is omitted in FIG. 5B.

Figure 6:
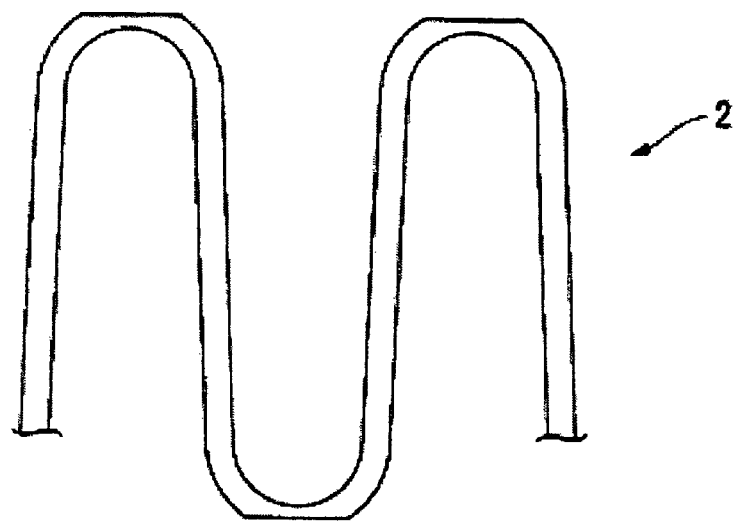
FIG. 6 is a view of assistance in explaining a modification of the method of manufacturing the microchannel structure according to the first embodiment of the invention.

Also, in the case where the height of the wavy plate member 2 from its top portion to the bottom portion is set higher than that of the groove 13 like this, a planarization step to make flat the top and bottom portions of the wavy plate member 2 as shown in FIG. 6 may be performed before the external peripheral wall member lower portion 12 is bonded. Specifically, the top and bottom portions of the wavy plate member 2 can be made flat by polishing the top and bottom portions. The execution of the planarization step like this makes possible to widen the contact area of the wavy plate member 2 and the external peripheral wall member 1 and to restrain the wavy plate member from being out of position when the external peripheral wall member lower portion 12 is bonded to the external peripheral wall member upper portion 11. Incidentally, the illustration of the spherical members 3 is omitted in FIG. 6, too.

It is preferable that the external peripheral wall member upper portion 11, the external peripheral wall member lower portion 12, and the wavy plate member 2 are subjected to diffusion bonding. As a result of this, the thermal resistance among the external peripheral wall member upper portion 11, the external peripheral wall member lower portion 12, and the wavy plate member 2 is reduced and as such, the efficiency of heat conduction can be increased further.

Figure 7:
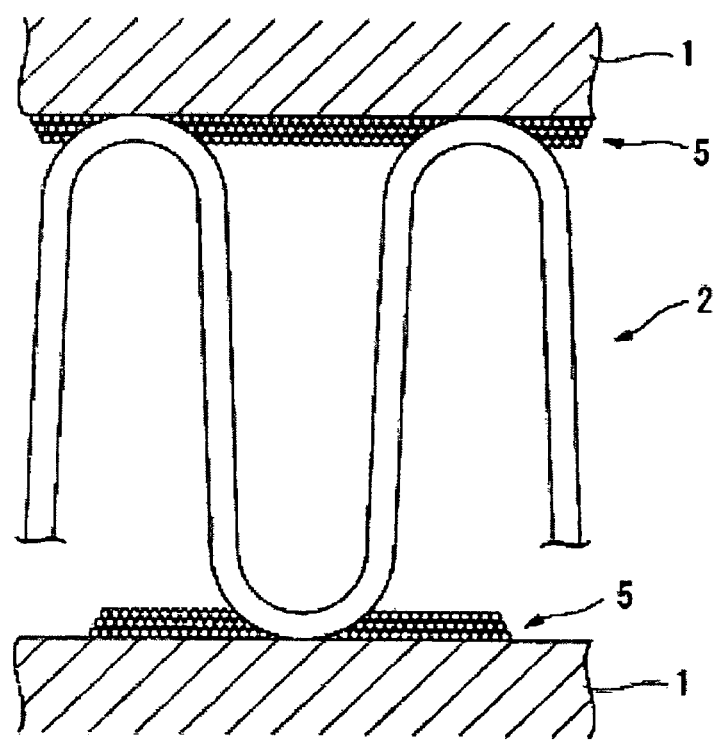
FIG. 7 is a view showing a modification of the microchannel structure according to the first embodiment of the invention.

Also, a paste material 5 having a heat conductive property may be interposed between the external peripheral wall member 1 and the wavy plate member 2 as shown in FIG. 7, instead of diffusion bonding of the external peripheral wall member 1 and the wavy plate member 2. Also, the external peripheral wall member 1 and the wavy plate member 2 can be connected thermally with reliability by interposing the paste material 5 between the external peripheral wall member 1 and the wavy plate member 2. Therefore, it is possible to increase the efficiency of heat conduction. Further, in the case of using a paste material 5 like this, it becomes possible to connect the external peripheral wall member 1 and the wavy plate member 2 thermally with reliability even when there are variations in the heights of the top and bottom portions of the wavy plate member 2, for example. As such paste material 5, a heat-hardening resin containing a filler having a high heat conductive property such as copper and a copper paste material may be used. Also, in FIG. 7, the illustration of the spherical members 3 is omitted.

Increasing the efficiency of heat conduction in this way enables the microchannel structure M1 of the first embodiment to be used as a heat exchanging component having an excellent cooling capacity.

Also, with the microchannel structure M1 according to the first embodiment and its manufacturing method, the external peripheral wall member 1 and the wavy plate member 2 are formed out of copper and as such, it becomes possible to extremely increase the efficiency of heat conduction in comparison with a microchannel structure formed using silicon or the like. In addition, copper is superior in the ease of fabrication and as such, the manufacture of a microchannel structure M1 can be made more readily.

As described above, according to the method of manufacturing a microchannel structure, the spacing between the opposed portions 21, 22 of the wavy plate member 2 can be made smaller readily by pressuring the wavy plate member 2 from its opposite sides in the direction of arrangement of the crests and troughs. Therefore, it is possible to form fine flow paths for a much shorter time in comparison with the case where they are formed by e.g. wire-electrical discharge-processing. Further, the press working step, pressuring step, and wavy plate member-disposing step are a processing step that can be carried out at a much lower cost in comparison with the wire-electrical discharge-processing and the like, and the etching. Hence, the method of manufacturing a microchannel structure enables the manufacture of a microchannel structure M1 at an extremely low cost.

Therefore, with the method of manufacturing a microchannel structure M1, it becomes possible to manufacture a microchannel structure for a short time at a low cost.

Also, the method of manufacturing a microchannel structure includes the spacer-forming step at which spherical members 3 are disposed in position to ensure the spacing between the opposed portions 21, 22 of the wavy plate member 2 and as such, even when the wavy plate member 2 is pressured from its opposite sides in the direction of arrangement of the crests and troughs at the pressuring step, the contact between the opposed portions 21, 22 of the wavy plate member 2 is prevented. Therefore, the clogging of the fine flow paths can be prevented.

Further, according to the method of manufacturing a microchannel structure, the spacer-forming step is carried out before the press working step. On this reason, spherical members 3 can be disposed in position on the plate-like member 2a. Therefore, it is possible to dispose the spherical members 3 readily.

Second Embodiment

Now, the second embodiment of the invention will be described. In the description on the second embodiment, the descriptions of the same parts as those in the first embodiment are omitted or simplified here.

Figure 8:
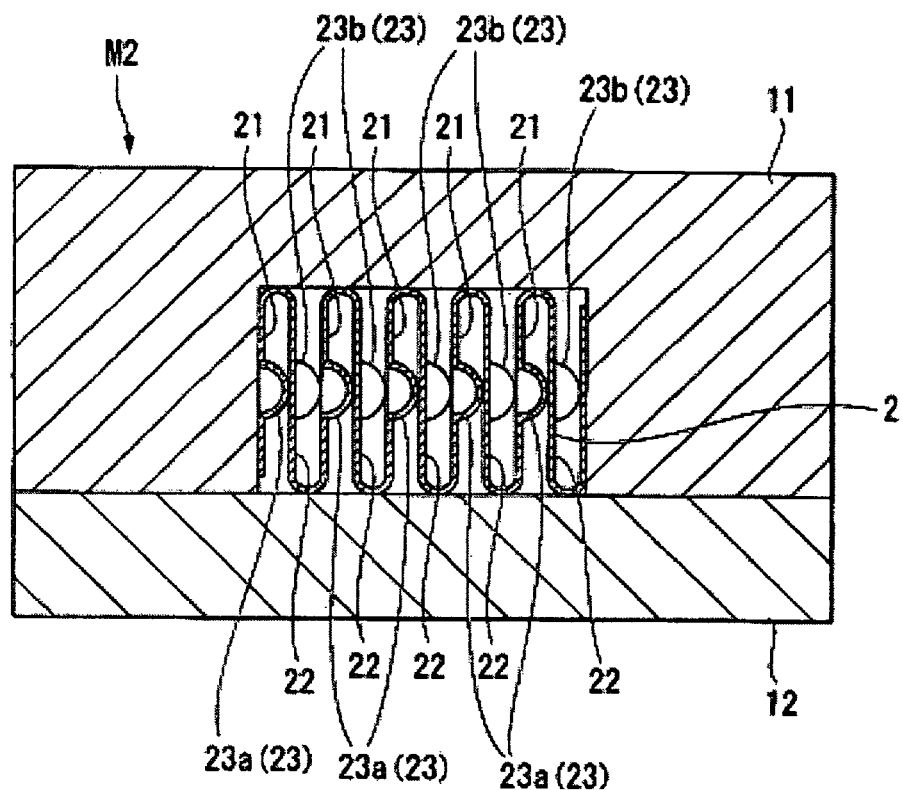
FIG. 8 is a sectional view of a microchannel structure according to a second embodiment of the invention.

FIG. 8 is a sectional view of a microchannel structure M2 according to the second embodiment. As shown in FIG. 8, in the second microchannel structure M2 a part of the wavy plate member 2 is formed as a protruding portion 23. The protruding portion 23 serves as a spacer.

A protruding portion 23a formed on an opposed portion 21 of the wavy plate member 2 (i.e. a protruding portion protruding from one face of the wavy plate member 2) and a protruding portion 23b formed on an opposed portion 22 of the wavy plate member 2 (i.e. a protruding portion protruding from the other face of the wavy plate member 2) are formed so as to be staggered in the direction of the ridge of the wavy plate member 2. This can prevent the protruding portion 23a formed on the opposed portion 21 of the wavy plate member 2 and the protruding portion 23b formed on the opposed portion 22 of the wavy plate member 2 from overlapping.

Therefore, this allows the protruding portion 23 to fulfill its function as a spacer with reliability.

Figure 9:
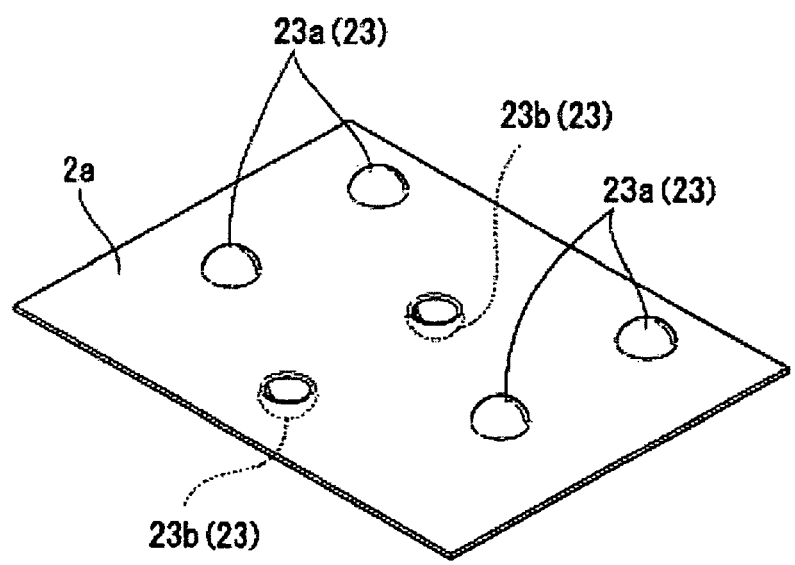
FIG. 9 is a view of assistance in explaining a method of manufacturing the microchannel structure according to the second embodiment of the invention.

In the case where a microchannel structure M2 according to the second embodiment like this is manufactured, in the spacer-forming step shown in the method of manufacturing a microchannel structure according to the first embodiment, protruding portions 23 are formed as shown in FIG. 9, instead of placing spherical members 3.

The protruding portions 23 as illustrated in the drawing can be formed readily by press working or the like. Also, it is possible to facilitate positioning of spacers in comparison with the case of using spherical members 3 as spacers.

Third Embodiment

Next, the third embodiment of the invention will be described. Also, in the description on the third embodiment, the descriptions of the same parts as those in the first embodiment are omitted or simplified here.

Figure 10:
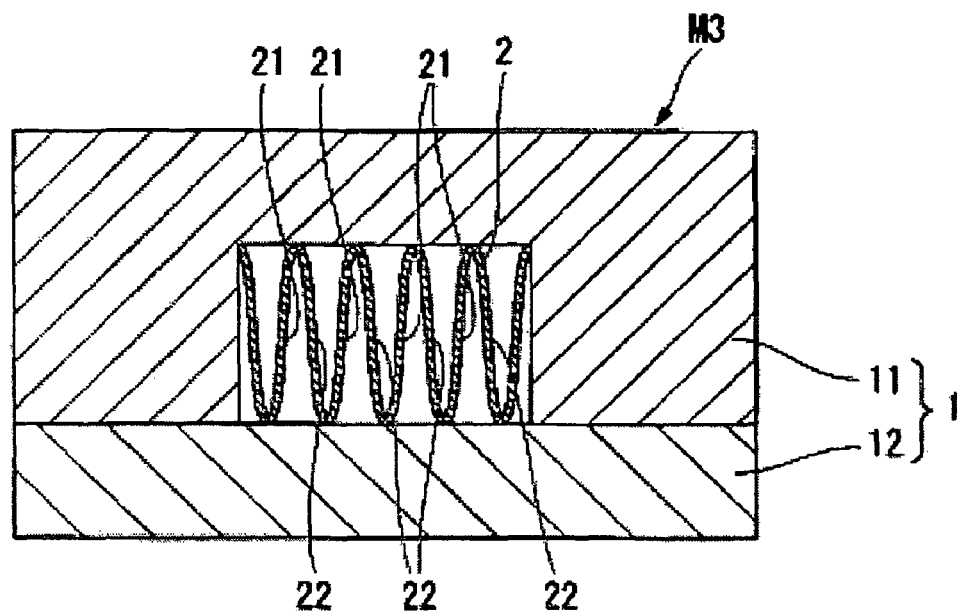
FIG. 10 is a sectional view of a microchannel structure according to a third embodiment of the invention.

FIG. 10 is a sectional view of a microchannel structure M3 according to the third embodiment. As shown in FIG. 10, the microchannel structure M3 according to the third embodiment does not have spacers (spherical members 3).

Figure 11:
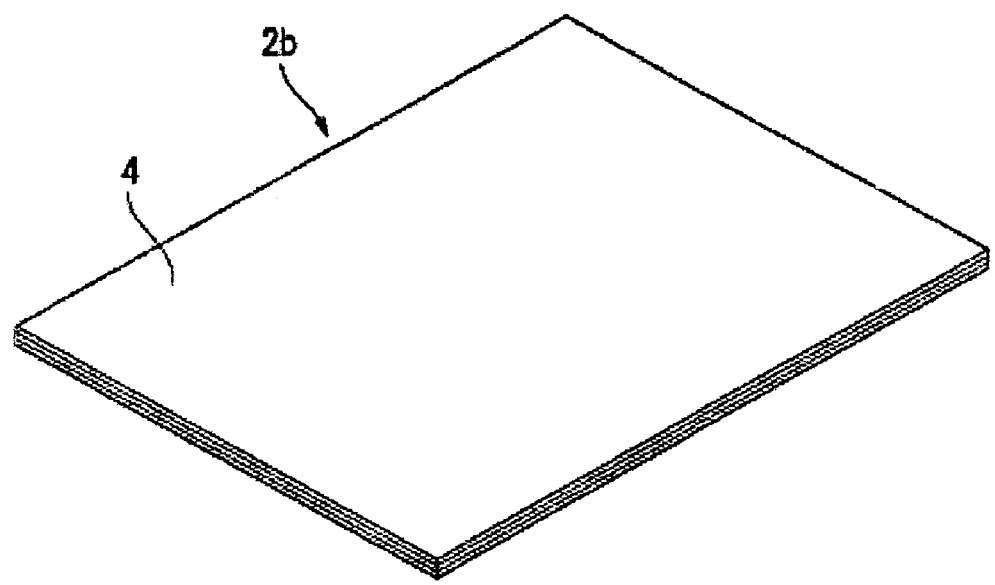
FIG. 11 is a view of assistance in explaining a method of manufacturing the microchannel structure according to the third embodiment of the invention.

A method of manufacturing a microchannel structure M3 having a structure like this does not include the spacer-forming step, by which a plate-like member 2b with a resin layer 4 formed over its surface as shown in FIG. 11 is used instead of the plate-like member 2a shown in the first embodiment.

Figure 12:
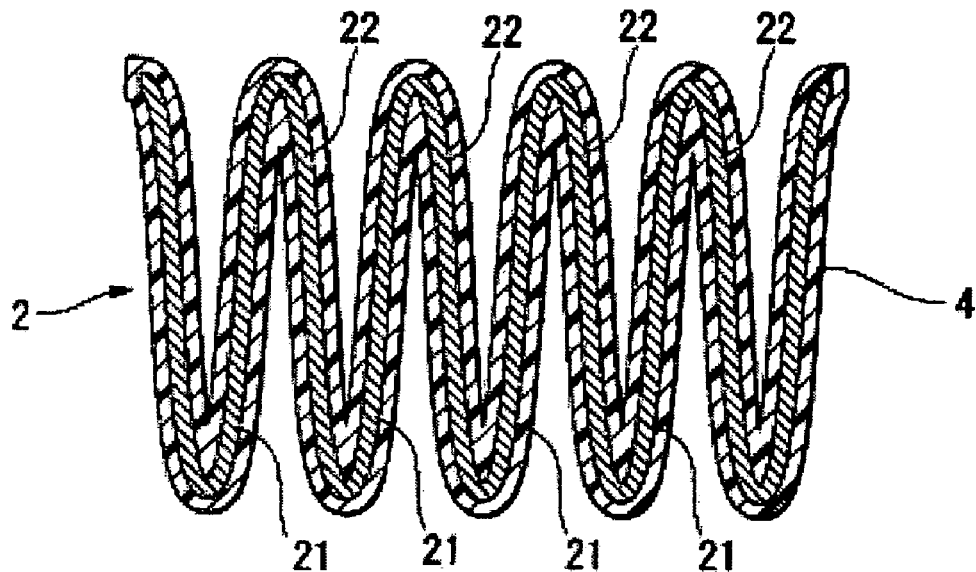
FIG. 12 is a view of assistance in explaining the method of manufacturing the microchannel structure according to the third embodiment of the invention.

This plate-like member 2b with a resin layer 4 formed over its surface is shaped into a wavy plate member 2 in a press working step. After that, when the wavy plate member 2 is pressured from its opposite sides in the direction of arrangement of the crests and troughs at the pressuring step, the contact between the opposed portions 21, 22 of the wavy plate member 2 is prevented because the resin layer 4 is formed on the surface of the wavy plate member as shown in FIG. 12.

Then, the resin layer 4 is removed from the wavy plate member 2 after the pressuring step (resin layer-removing process), and the wavy plate member-disposing step is performed. Thus, clogging of fine flow paths owing to the contact between the opposed portions 21, 22 of the wavy plate member 2 can be prevented from being caused.

Incidentally, in the resin layer-removing process, the resin layer 4 may be removed by dissolving it by heat and removed, otherwise it may be removed by dissolving it by a chemical.

Further, while in the third embodiment the plate-like member 2b having the resin layer 4 formed on both the faces thereof is used, a plate-like member having the resin layer 4 formed on only one face thereof may be used.

Figure 13:
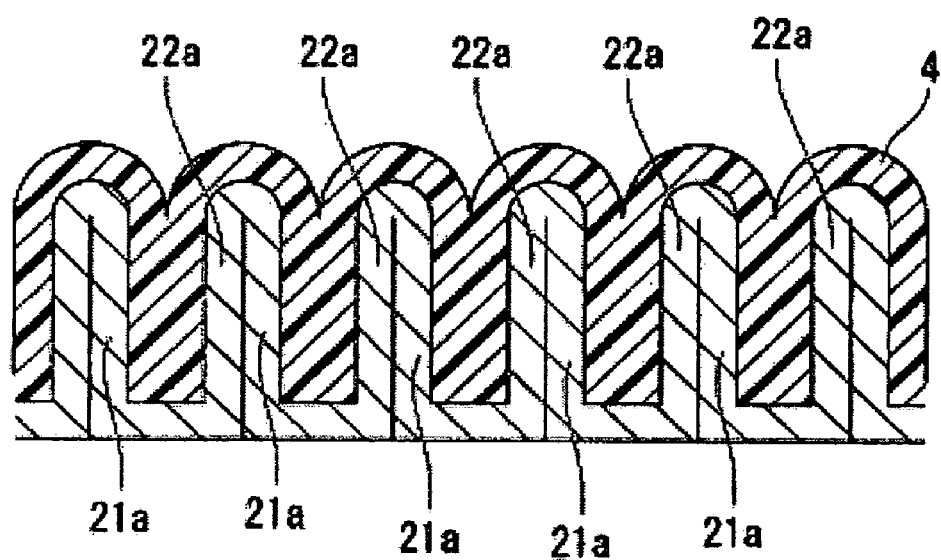
FIG. 13 is a view of assistance in explaining a modification of the method of manufacturing the microchannel structure according to the third embodiment of the invention.

When this plate-like member is pressured from its opposite sides in the direction of arrangement of the crests and troughs at the pressuring step, the contact between the opposed portions 21a, 22a formed in the face, over which the resin layer 4 is formed, is prevented, and the side of the face of the wavy plate member, over which no resin layer 4 is formed, is squashed and brought into close contact as shown in FIG. 13. Even in a case like this, the opposed portion 21a and the opposed portion 22a are spaced apart and as such, a path for a fluid can be ensured. In the case where the resin layer 4 is formed on only one face of the plate-like member, lower portions of the wavy plate member are made flat as shown in FIG. 13 and as such, the contact area of the wavy plate member and external peripheral wall member 1 can be widened. Thus, the efficiency of heat conduction can be increased.

Fourth Embodiment

Now, the fourth embodiment of the invention will be described. Also, in the description on the fourth embodiment, the descriptions of the same parts as those in the first embodiment are omitted or simplified here.

Figure 14:
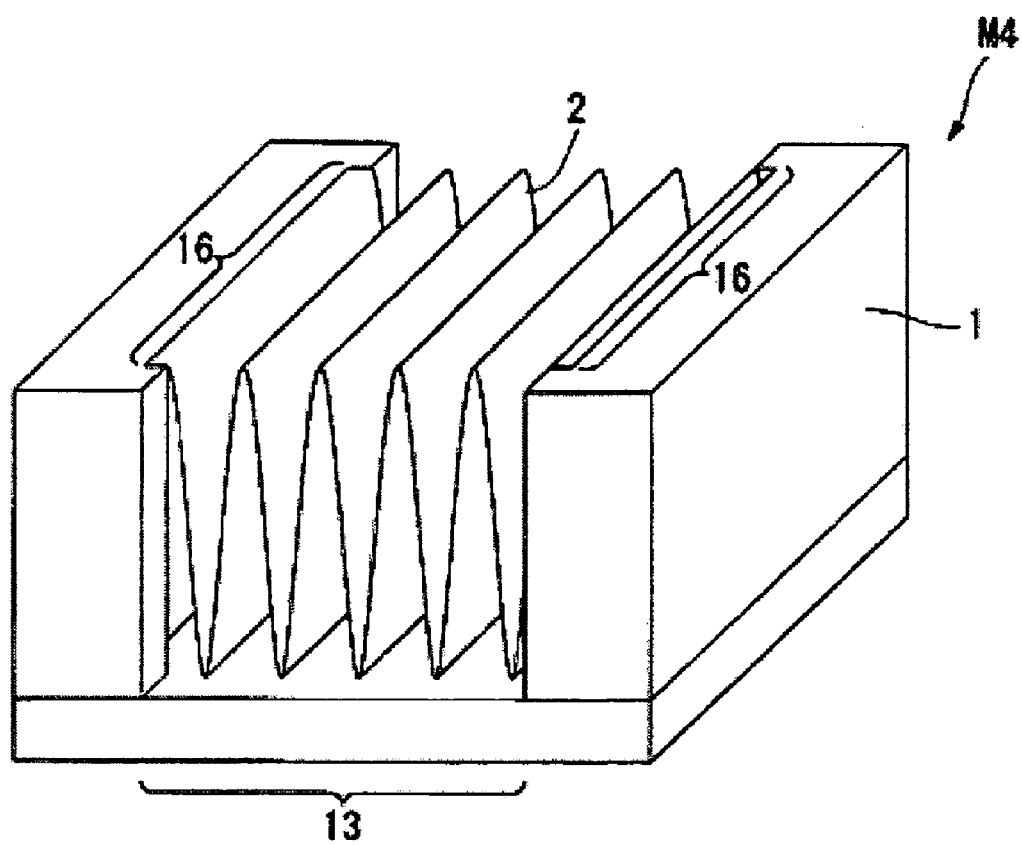
FIG. 14 is a perspective view of a microchannel structure according to a fourth embodiment of the invention.

FIG. 14 is a perspective view of a microchannel structure M4 according to the fourth embodiment. In the perspective view of FIG. 14, illustration of the part of the external peripheral wall member above the groove 13 is omitted for the sake of convenience of the description. Also, the illustration of the spherical members 3 is omitted.

As shown in FIG. 14, in the microchannel structure M4 according to the fourth embodiment, a pair of notch structures 16 that prevents the wavy plate member 2 from being out of position in a direction of fluid flow is formed in the external peripheral wall member 1. In addition, two end portions of the wavy plate member 2 are fit in the paired notch structures 16.

By adopting such configuration, it becomes possible to prevent the wavy plate member 2 from being out of position due to flow of a fluid or during a step for its manufacture.

Fifth Embodiment

Now, a light source device having a microchannel structure according to any one of the above-described embodiments will be described as a fifth embodiment of the invention. In the description on the fifth embodiment, a light source device including a microchannel structure M1 according to the first embodiment will be described. However, it is not limited to the microchannel structure M1 according to the first embodiment. The light source device may include a microchannel structure M2 according to the second embodiment, a microchannel structure M3 according to the third embodiment, or a microchannel structure M4 according to the fourth embodiment.

Figure 15:
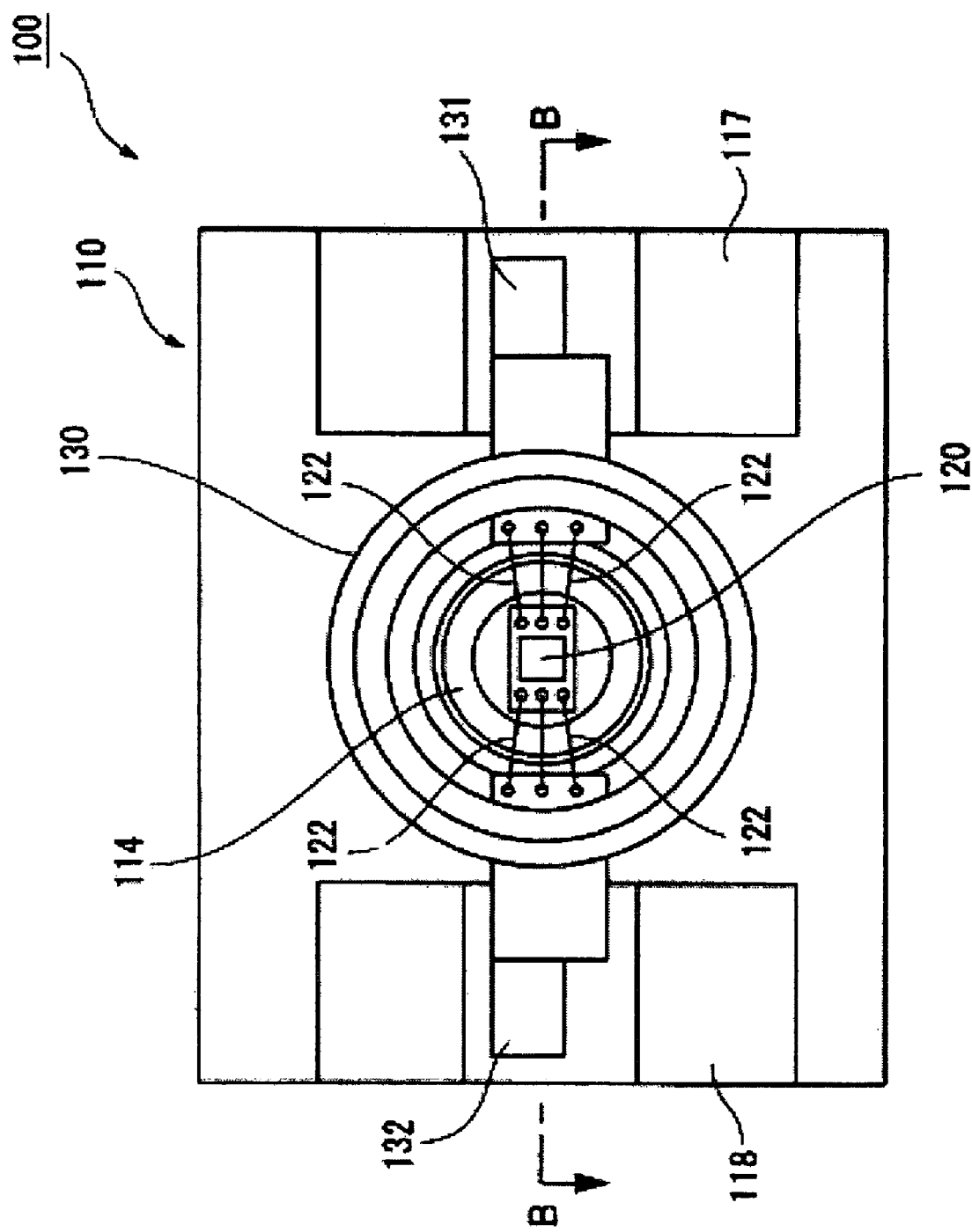
FIG. 15 is a view showing a schematic configuration of a light source device according to a fifth embodiment of the invention.
Figure 16:
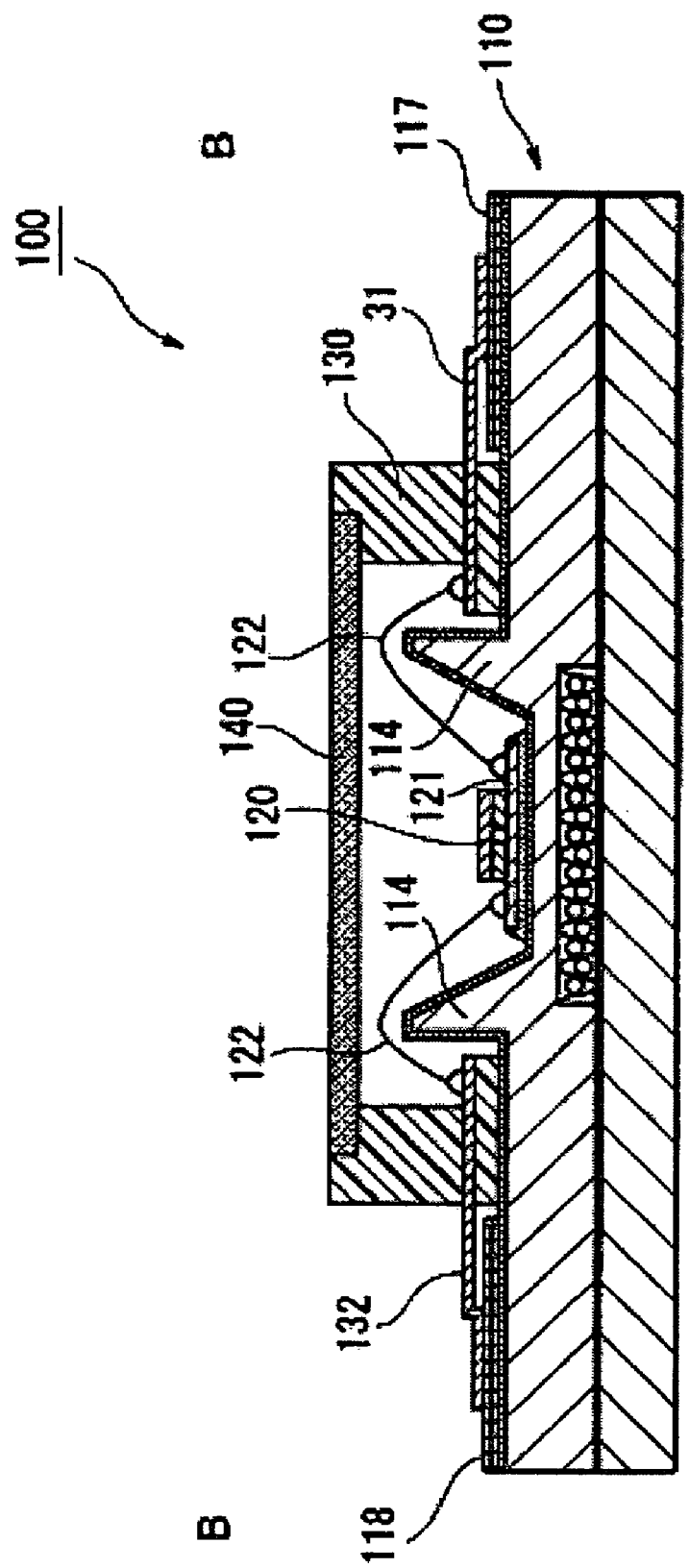
FIG. 16 is a sectional view of the light source device taken along the line B-B in FIG. 15.

FIG. 15 is a plane view showing a schematic configuration of the light source device 100 according to the fifth embodiment. FIG. 16 is a sectional view of the light source device taken along the line B-B in FIG. 15.

As shown in the drawings, the light source device 100 according to the fifth embodiment includes: a base 110; an LED chip 120 (a solid light-emitting source); a resin frame 130; and a cap 140.

The base 110 is intended to put the LED chip 120 (solid light-emitting source) thereon, and is constituted by a microchannel structure according to any one of the above-described embodiments.

The LED chip 120 emits light and generates heat when it is supplied with a current. The LED chip 120 is formed with silicon, etc. The LED chip 120 is mounted, by flip chip mounting, on a sub-mount 121 on which a trace to supply electric power to the LED chip 120 is formed. The LED chip 120 is mounted on the base 110 together with the sub-mount 121 by a heat conductive adhesive (e.g. silver paste).

On an upper face of the base 110, a reflector 114 is disposed, and further the resin frame 130 is disposed so as to surround the reflector 114. Further, the cap 140 is supported by and disposed on an upper portion of the resin frame 130. In a space defined by the cap 140 and the resin frame 130, silicon oil or the like is filled. As shown in FIGS. 15 and 16, the resin frame 130 has outer leads 131, 132 that have been inserted therein in its molding. One ends of the outer leads 131, 132 are connected to flexible boards 117, 118 disposed on the base 110, and the other ends are connected through gold wires 122 or the like to connection pads formed on the sub-mount 121. The LED chip 120 is supplied with an electric power through the sub-mount 121, the flexible boards 117, 118, the outer leads 131, 132, and the gold wires 122. In this embodiment, as shown in FIG. 15, three gold wires 122 are connected to each of the outer leads 131, 132. However, the number of gold wires 122 is changed depending on the amount of electric power supplied to the LED chip 120.

In the light source device 100 according to the embodiment configured in this way, when the LED chip 120 is supplied with current, the LED chip 120 emits light and the emitted light is sent out from the light source device 100 through the cap 140. The light laterally sent out from the LED chip 120 is reflected by the reflector 114 toward the cap 140 and then sent out from the light source device 100 through the cap 140.

In the light source device 100 according to the embodiment, a microchannel structure M1 according to the first embodiment is used as the base 110. Hence, it becomes possible to efficiently cool the LED chip 120 by flowing a cooling medium (fluid) in the fine flow paths. Thus, the failure owing to the heat generated from the LED chip 120 can be prevented. Therefore, the light source device 100 is made superior in reliability.

In addition, the microchannel structure M1 according to the first embodiment can be mass-produced at a low cost as described above and as such, a light source device 100 including the microchannel structure M1 as its base 110 can be manufactured at a low cost.

Sixth Embodiment

Next, a projector including a light source device 100 according to the fifth embodiment will be described as a sixth embodiment.

Figure 17:
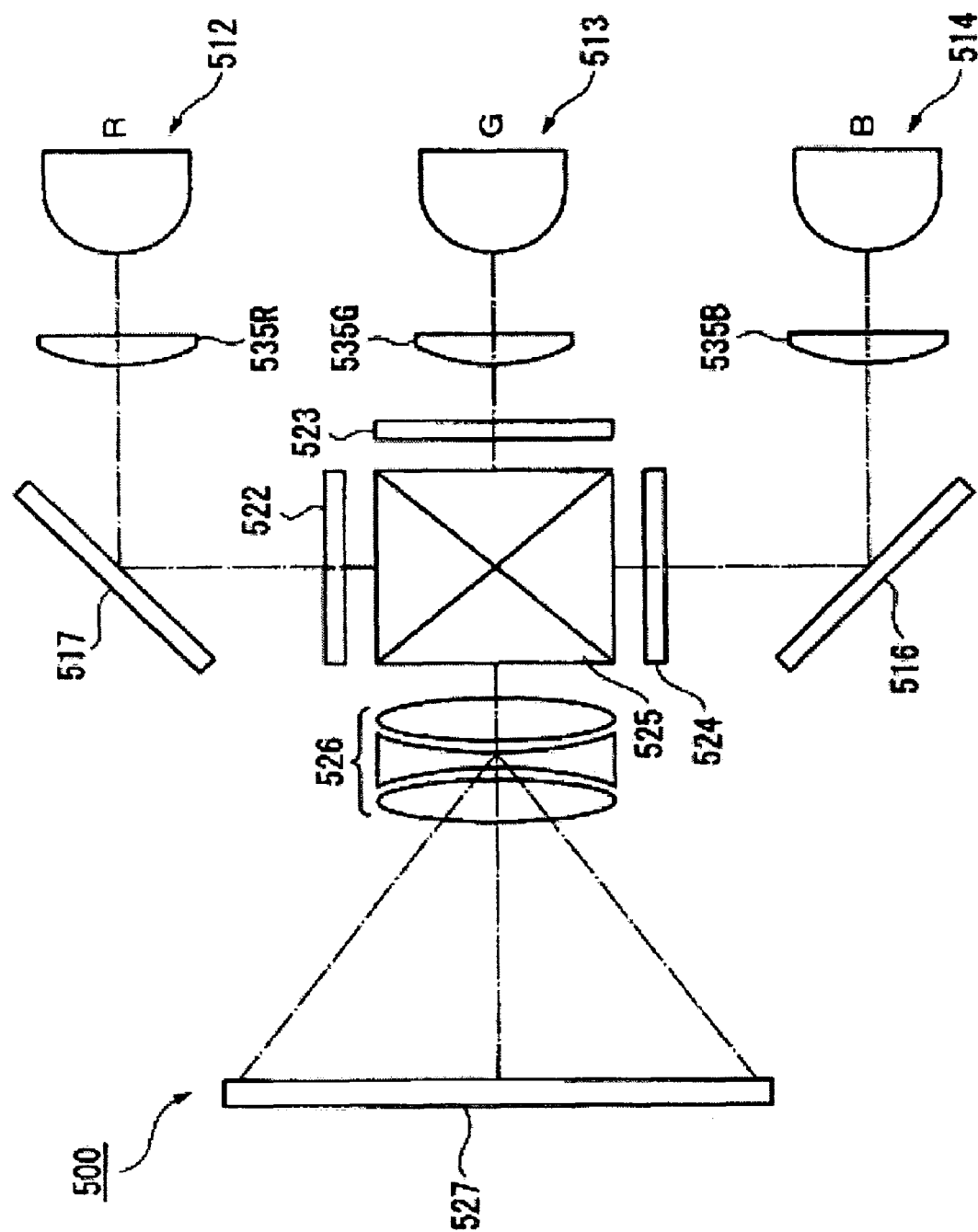
FIG. 17 is a view showing a schematic configuration of a projector according to a sixth embodiment of the invention.

FIG. 17 is an illustration of the projector 500 including the light source device according to the fifth embodiment. In the drawing, the reference numerals 512, 513, and 514 each represent the light source device according to the fifth embodiment, and the numerals 522, 523, and 524 each represent a liquid crystal light valve, the numeral 525 represents a cross dichroic prism, and the numeral 526 represents a projector lens.

The projector 500 shown in FIG. 17 includes three light source devices 512, 513, 514 configured as described in the fifth embodiment. For the light source devices 512, 513, 514, LED chips that emit a red (R) light, a green (G) light, and a blue (B) light are adopted respectively. For the purpose of uniformizing the distribution of illumination of light from each light source, a rod lens or a fly's-eye lens may be disposed downstream of each light source device as a uniformly illuminating optical system.

Light beams coming from the red-color light source device 512 pass through a superimposing lens 535R, undergo reflection by a reflection mirror 517, and go into a red color light-dedicated liquid crystal light valve 522. Light beams coming from the green-color light source device 513 pass through a superimposing lens 535G and go into a green color light-dedicated liquid crystal light valve 523. Further, light beams coming from the blue-color light source device 514 pass through a superimposing lens 535B, undergo reflection by a reflection mirror 516 and go into a blue color light-dedicated liquid crystal light valve 524. Light beams coming from each light source are superimposed in a display area of the corresponding liquid crystal light valve by passing through the superimposing lens, and thus the liquid crystal light valve is illuminated uniformly.

In addition, polarizing plates (not shown) are disposed on incident and output sides of each liquid crystal light valve, respectively. Of light beams coming from each light source, only light beams linearly polarized in a given direction pass through the incident-side polarizing plate, and go into the liquid crystal light valve. Also, a polarization-conversion means (not shown) may be provided in front of the incident-side polarizing plate. In this case, light beams reflected by the incident-side polarizing plate can be recycled and made to go into the liquid crystal light valve, and therefore the efficiency of use of light can be increased.

Three color lights modulated by the respective liquid crystal light valves 522, 523, 524 go into the cross dichroic prism 525. The prism is formed by gluing four right-angle prisms together. On the inner faces of the right-angle prisms, there are located a dielectric multilayer film that reflects a red color light and a dielectric multilayer film that reflects a blue color light, which are disposed in the form of a crisscross. The dielectric multilayer films synthesize the three color lights to form light that expresses a color image. The synthesized light is projected on a projection screen 527 by the projector lens 526, which is a projection optical system, and then an enlarged image is displayed.

The light source device according to the embodiment described above can be increased in its brightness by cooling the LED chip and can be manufactured at a low cost. Therefore, by incorporating the above-described light source device, a projector superior in display properties can be provided at a low cost.

Preferred embodiments of a microchannel structure and its manufacturing method, a light source device and a projector in association with the invention have been described above with reference to the accompanying drawings. However, it is needless to say that the invention is not limited to the embodiments. The forms, combinations, etc. of the constituent members shown in the above-described embodiments are merely examples. Various modifications on them may be made based on a design need, etc. within a scope not departing from the subject matter of the invention.

For example, in the first embodiment spherical members 3 are used as spacers, and in the second embodiment protruding portions 23 are used as spacers. However, the invention is not limited to these embodiments. For example, metal wires or the like, which extend along the direction of the ridge of the wavy plate member 2, may be used as spacers.

Further, in the first to fourth embodiments, the groove 13 is formed in the external peripheral wall member upper portion 11. However, the invention is not so limited. The groove may be formed in the external peripheral wall member lower portion 12.

Still further, in the first to fourth embodiments, the external peripheral wall member 1 and the wavy plate member 2 are formed out of copper. However, the invention is not so limited. The external peripheral wall member 1 and the wavy plate member 2 may be formed using another material. However, in the case of using the microchannel structure as a heat exchanging component, it is preferable that such material is a material having a high efficiency of heat conduction.

In the method of manufacturing a microchannel structure according to the first, second or fourth embodiment, a surface treatment step to vandalize a surface of the plate-like member 2a may be carried out. Performing this surface treatment step widens the surface area of the wavy plate member 2 and thus widens the contact area of a fluid and the wavy plate member 2. Therefore, the efficiency of heat conduction can be increased further.

Figure 18:
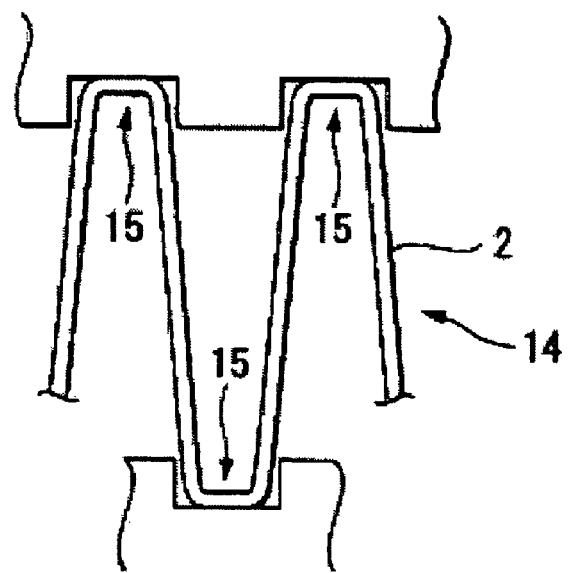
FIG. 18 is a view showing a modification of the microchannel structure.

Also, in the first to fourth embodiments, as shown in FIG. 18, positioning grooves 15 to which the top and bottom portions of the wavy plate member 2 are fit may be formed in the external peripheral wall member. The positioning of the wavy plate member 2 is facilitated by forming such positioning grooves 15. In addition, the contact area of the wavy plate member 2 and the external peripheral wall member 1 can be widened, and therefore the efficiency of heat conduction can be increased. Incidentally, the positioning grooves 15 can be formed readily by dicing or the like.

Figure 19:
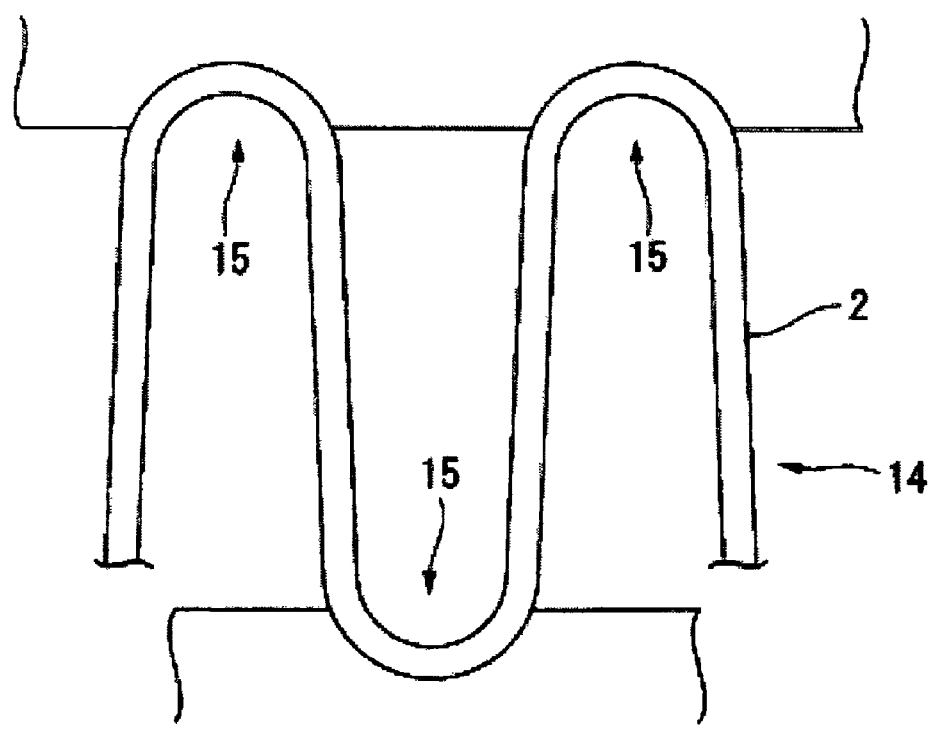
FIG. 19 is a view showing another modification of the microchannel structure.
Figure 20:
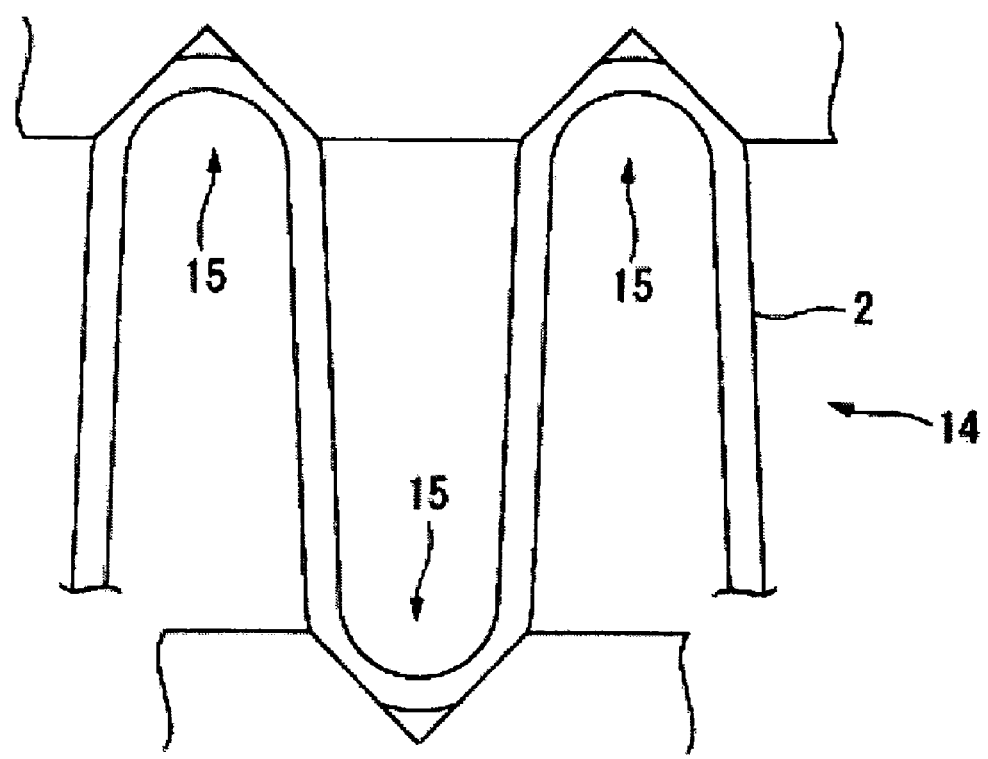
FIG. 20 is a view showing another modification of the microchannel structure.

The positioning grooves 15 are not necessarily a groove having a rectangular form in its sectional view as shown in FIG. 18. The groove may have a hemispheric form in its sectional view as shown in FIG. 19, or may have a triangular form in its sectional view as shown in FIG. 20.

While in the sixth embodiment an LED chip is adopted as a solid light-emitting source, a semiconductor laser or the like may be adopted as a solid light-emitting source instead. Further, while in the above-described projector, a liquid crystal light valve is adopted as a light-modulation means, a small mirror array device or the like may be adopted as a light-modulation means.

The entire disclosure of Japanese Patent Application Nos: 2005-035868, filed Feb. 14, 2005 and 2005-314061, filed Oct. 28, 2005 are expressly incorporated by reference herein.

What is claimed is:

1. A microchannel structure with a fine flow path through which a fluid flows, comprising:
    a wavy plate member fabricated into a wavy form;
    an external peripheral wall member that surrounds the wavy plate member;
    a spacer that ensures a spacing between opposed portions of the wavy plate member; and
    a pair of notch structures, each having an outer wall section arranged to prevent lateral movement of the wavy plate member with respect to a direction of flow, each notch structure having a pair of end portions extending laterally inwardly toward the wavy plate member and arranged to prevent longitudinal movement of the wavy plate member with respect to the direction of flow;
    wherein
    the fine flow path is defined by the wavy plate member and the external peripheral wall member;
    the pair of notch structures are formed in the external peripheral wall member along the direction of flow of the fluid; and
    two end portions of the wavy plate member are fit in the paired notch structures.

2. The microchannel structure of claim 1, wherein the spacer is a spherical member disposed between the opposed portions.

3. The microchannel structure of claim 1, wherein the spacer is a protruding portion constituted by a part of the opposed portion.

4. The microchannel structure of claim 1, wherein top and bottom portions of the wavy plate member are in contact with the external peripheral wall member.

5. The microchannel structure of claim 1, wherein the wavy plate member and the external peripheral wall member are formed out of copper.

6. The microchannel structure of claim 1, wherein positioning grooves are formed in the external peripheral wall member, in which the top and bottom portions of the wavy plate member are fit individually.

7. The microchannel structure of claim 1, further comprising a paste material having a heat conductive property interposed between the wavy plate member and the external peripheral wall member.

8. A light source device comprising:
    a solid light-emitting source that emits light and generates heat when the solid light-emitting source is supplied with a current; and
    a base on which the solid light-emitting source is put,
    wherein the base is a microchannel structure with a fine flow path through which a fluid flows, which includes:

a wavy plate member fabricated into a wavy form;

an external peripheral wall member that surrounds the wavy plate member;

a spacer that ensures a spacing between opposed portions of the wavy plate member; and a pair of notch structures, each having an outer wall section arranged to prevent lateral movement of the wavy plate member with respect to a direction of flow, each notch structure having a pair of end portions extending laterally inwardly toward the wavy plate member and arranged to prevent longitudinal movement of the wavy plate member with respect to the direction of flow;

wherein the fine flow path is defined by the wavy plate member and the external peripheral wall member;

the pair of notch structures are formed in the external peripheral wall member along the direction of flow of the fluid; and two end portions of the wavy plate member are fit in the paired notch structures.

9. The microchannel structure of claim 1, wherein an end portion of the wavy plate member contacts and attaches inside the notch structure.

* * * * *